(12) United States Patent
Okawa et al.

(10) Patent No.: US 6,522,012 B2
(45) Date of Patent: *Feb. 18, 2003

(54) SEMICONDUCTOR DEVICE WITH HIHG RESISTIVITY

(75) Inventors: Shigeaki Okawa, Tochigi (JP);
Toshiyuki Ohkoda, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/119,711

(22) Filed: Apr. 11, 2002

(65) Prior Publication Data

US 2002/0117730 A1 Aug. 29, 2002

Related U.S. Application Data

(62) Division of application No. 09/534,872, filed on Mar. 24, 2000, now Pat. No. 6,392,307.

(30) Foreign Application Priority Data

Mar. 26, 1999 (JP) .............................. 11-83782

(51) Int. Cl.$^7$ ................................................ H01L 23/48
(52) U.S. Cl. ..................................................... 257/773
(58) Field of Search ................. 257/218, 656, 257/773

(56) References Cited

U.S. PATENT DOCUMENTS

| | | | |
|---|---|---|---|
| 3,906,541 A | * | 9/1975 | Goronkin ............. 148/DIG. 84 |
| 3,973,271 A | | 8/1976 | Okumura et al. |
| 4,033,788 A | * | 7/1977 | Hunsperger et al. . 148/DIG. 84 |
| 4,294,002 A | | 10/1981 | Jambotkar et al. |
| 5,017,985 A | | 5/1991 | Lin |
| 5,273,912 A | | 12/1993 | Hikida |
| 5,381,105 A | | 1/1995 | Phipps |
| 5,670,819 A | | 9/1997 | Yamaguchi |
| 6,242,759 B1 | | 6/2001 | Yamazaki et al. |

FOREIGN PATENT DOCUMENTS

| | | |
|---|---|---|
| EP | 0 627 767 A1 | 12/1994 |
| GB | 2 243 485 A1 | 10/1991 |
| JP | 61-160962 | 7/1986 |
| JP | 4-96343 | 3/1992 |
| JP | 7-122604 | 5/1995 |

* cited by examiner

Primary Examiner—Allan R. Wilson
(74) Attorney, Agent, or Firm—Wenderoth, Lind & Ponack, L.L.P.

(57) ABSTRACT

The present invention is a semiconductor device, which is able to provide a desired output voltage of an ECM without signal loss caused by parasitic capacitances. Such a semiconductor device comprises a semiconductor substrate; integrated network elements including an input transistor being integrated on the semiconductor substrate, the input transistor having an input terminal; a first bonding pad connected to the input terminal of the input transistor for testing properties of the input transistor; a second bonding pad connected to one of the integrated network elements for external connection; and a surface area of the first coding pad being smaller than that of the second bonding pad.

4 Claims, 7 Drawing Sheets

PRIOR ART

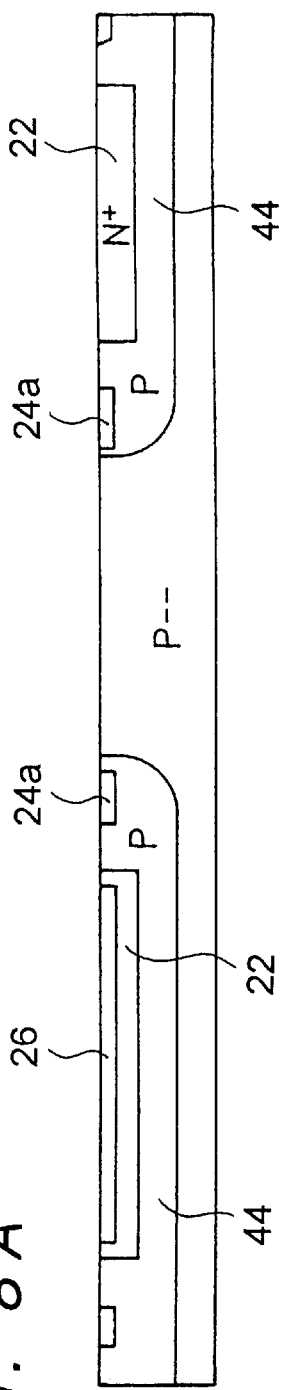
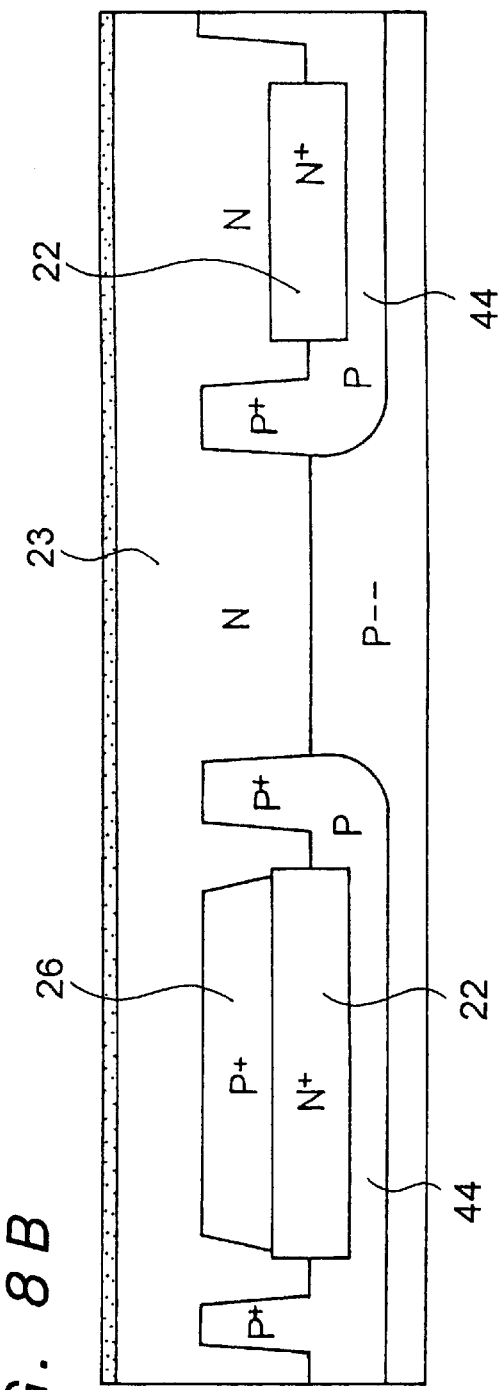
FIG. 8A
FIG. 8B

SEMICONDUCTOR DEVICE WITH HIHG RESISTIVITY

This is a divisional application of Ser. No. 09/534,872, filed Mar. 24, 2000, now U.S. Pat. No. 6,392,307.

BACKGROUND OF THE INVENTION

1. Field of the Invention

The present invention relates in general to a semiconductor device, and relates in particular to a semiconductor device, which is appropriate for driving an electret condenser microphone.

2. Description of the Prior Art

An electret condenser microphone (ECM) is an element, which is used to convert aerial vibrations such as voice to electric signals representing changes in capacitance values. Because its output signal is very weak, an element for amplifying the output signal of the ECM is required to have characteristics of high input impedance, high gain, and low noise.

There are elements that satisfy these requirements, which are the junction field-effect transistor (J-FET) and the metal-oxide semiconductor field-effect transistor (MOSFET). As described in Japanese Laid-Open Patent Publication 58-197885, for example, especially the J-FET element is easily mountable to be integrated in a bipolar integrated circuit.

FIG. 1 shows a cross-section of a p-channel J-FET device. As shown in the diagram, the J-FET device includes a p-type substrate 1; an n-type epitaxial layer 2 deposited on the substrate 1; an $n^+$-type buried layer 3 formed between the substrate 1 and epitaxial layer 2; a $p^+$-type isolation region 4 penetrating from the surface of the epitaxial layer 2 into the substrate 1 and surrounds the buried layer 3 to form an island region 5.

An $n^+$-type top gate region 6 is formed in the surface of the island region 5. A p-type channel region 7 is formed below the top gate region 6. A $p^+$-type source region 8 is formed on one end of the channel region 7, and a $p^+$-type drain region 9 is formed on the other end. Highly concentrated $n^+$-type gate contact regions 10 are formed on the outside of the source region 8 and drain region 9, respectively.

An insulating film 16 is deposited on the top surface of the entire device. A source electrode 11S, drain electrode 11D, and gate electrode 11G are connected to above mentioned regions 8,9,10 respectively through the insulating film 16. The resulting configuration is that of a conventional p-channel J-FET.

According to the p-channel J-FET, a pn junction is formed in the gate region. Hence, the junction can be reverse-biased to control the width of the depletion layer and restrict the drain current.

When integrating other functions in the semiconductor device, a p-type base region 12, an $n^+$-type emitter region 13, and an $n^+$-type collector contact region 14 are formed in another island region 5, which works as an npn bipolar transistor. The npn transistor processes signals received by the J-FET element, acting as an element of overall construction of an integrated network.

However, when the elements above mentioned are used to amplify signals from an ECM, it may be required to provide an extended electrode 15 in the device that has a surface area much larger than that of the device's electrode pads.

This construction generates a parasitic capacitance C1 between the extended electrode 15 and epitaxial layer 2 sandwiching the insulating film 16 therebetween, and a pn junction capacitance C2 between the epitaxial layer 2 and substrate 1. These capacitances are connected to a substrate-biased ground potential GND. The values of these capacitances can reach as much as several tens of pF, which is a level that cannot be ignored.

FIG. 2 shows a schematic circuit diagram including capacitances C1 and C2. The ECM is connected on one end to a gate (input terminal) of a J-FET 17. The source electrode of the J-FET 17 is grounded. The drain electrode of the J-FET 17 is connected to an output terminal OUT. The output terminal OUT is connected to an integrated network, including an npn transistor or the like that is formed on the same substrate. The capacitances C1 and C2 described above are connected in series between the gate electrode of the J-FET 17 and the ground potential. Accordingly, signals output from the ECM flow to the ground via the capacitances C1 and C2, as illustrated in the diagram by a current i. As a result, the signal level applied to the gate electrode of the J-FET 17 drops, thus the desired output voltage can not be obtained.

Sometimes it is required to add a test pad for measuring the properties of the input transistor during the fabrication process. As shown in FIG. 3, a test pad 18 is formed on the insulating film 16, as with the extended electrode 15 shown in FIG. 1, and connects to the gate electrode 11G of the input J-FET for testing the behavior of the J-FET before shipping. As with the input/output pads of the integrated network, the test pad 18 is usually formed in a rectangular shape with one side measuring 100–300 μm. The $p^+$-type isolation region 4 is formed on the underside of the test pad 18. As a result, a parasitic capacitance C3 is generated by the test pad 18 and the isolation region 4. This capacitance C3 is connected in parallel to the capacitances C1 and C2, as shown in FIG. 2, further increasing leakage in the current flowing to the ground potential GND.

SUMMARY OF THE INVENTION

In view of the foregoing, it is an object of the present invention to provide a semiconductor device, which is able to provide a desired output voltage of the ECM without signal loss caused by parasitic capacitances.

To achieve the object of the present invention, there is provided a semiconductor device, comprising: a semiconductor substrate; integrated network elements including an input transistor being integrated on the semiconductor substrate, the input transistor having an input terminal; a first, bonding pad connected to the input terminal of the input transistor for testing properties of the input transistor; a second bonding pad connected to one of the integrated network elements for external connection; and a surface area of the first bonding pad being smaller than that of the second bonding pad.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIGS. 8A and 8B are cross-sectional diagrams showing the fabrication process of the semiconductor device of FIG. 4.

DETAILED DESCRIPTION OF THE PREFERRED EMBODIMENT

A semiconductor device according to a preferred embodiment of the present invention will be described while referring to the accompanying drawings.

Figure 4:
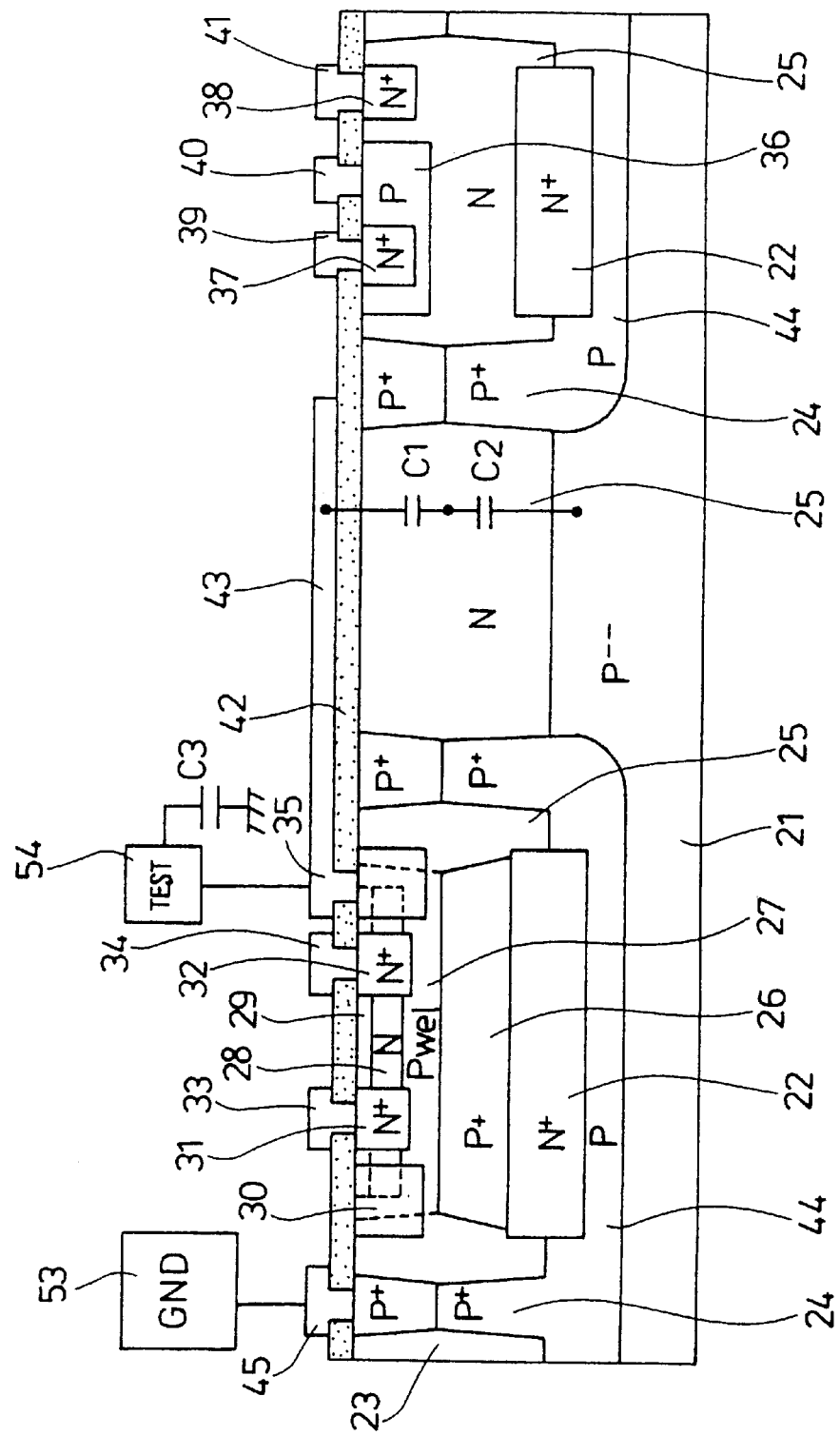
FIG. 4 is a cross-sectional diagram showing the structure of a semiconductor device according to the present invention.

FIG. 4 is a cross-sectional diagram showing a semiconductor device of the present invention. An n-channel junction field-effect transistor (J-FET) is formed and integrated on the same substrate with an npn transistor and so on.

The semiconductor device shown in FIG. 4 includes a single-crystal silicon substrate 21. The resistivity of the substrate used in ordinary bipolar integrated circuits is usually 2–4 Ωcm or at most 40–60 Ωcm. In contrast, the substrate 21 used in the semiconductor device of the present embodiment has a resistivity of as high as 100–5,000 Ωcm.

In the surface of the substrate 21, an $n^+$-type buried layer 22 is formed, and an n-type epitaxial layer 23 is formed on the buried layer 22. A plurality of island regions 25 is formed in the epitaxial layer 23, which is junction-isolated by $p^+$-type isolation regions 24. One of the island regions 25 is provided with a $p^+$-type buried layer 26 superimposed on the $n^+$-type buried layer 22. The $p^+$-type buried layer 26 is connected with a p-type well region 27 formed by diffusion from the surface of the island region 25. The surface of the well region 27 is formed with an n-type channel region 28 and a $p^+$-type top gate region 29 formed on top of the channel region 28. The n-type channel region 28 is buried at a level below the surface of the epitaxial layer 23. The well region 27 serves as a back gate.

$P^+$-type gate contact regions 30 are formed so as to cover the diffused surface of the well region 27 having p-type low concentration, and the $p^+$-type gate contact regions 30 are superimposed on the ends of the channel region 28 and top gate region 29. An $n^+$-type source region 31 and an $n^+$-type drain region 32 are formed so as to penetrate the channel region 28. A potential applied to the gate controls a width of the depletion layer in the channel region 28 in order to control current in the channel between the source and drain regions. A silicon oxide film 42 is deposited on the surface of the entire device. A source electrode 33, a drain electrode 34, and a gate electrode 35 are formed to connect to the source region 31, drain region 32, and gate contact regions 30, respectively.

A p-type base region 36 is formed in the surface of another island region 25 and an $n^+$-type emitter region 37 is formed in the surface of the base region 36, thereby completing an npn transistor with the island region 25 serving as the collector. An $n^+$-type collector contact region 38 is also formed in the island region 25. An emitter electrode 39, base electrode 40, and collector electrode 41 are formed to connect to the emitter region 37, base region 36, and collector contact region 38, respectively.

Each electrode in this group is in ohmic contact with the surface of the corresponding diffused region and extends above the oxide film 42, which covers the surface of the epitaxial layer 23. The electrodes form an integrated network by connecting to each circuit element. The gate electrode 35, which is connected to the J-FET gate, extends above the oxide film 42 and connects to an extended electrode 43. The extended electrode 43 might be composed in a circular pattern having a diameter of 1.0–1.5 mm. The extended electrode 43 connects to an ECM.

One of the island regions 25 surrounded by the isolation region 24 is positioned under the extended electrode 43 such that the oxide film 42 is interposed between the extended electrode 43 and island region 25. The substrate 21 having a high resistivity is disposed below the island region 25. This portion of the device is not provided with an $n^+$-type buried layer 22 and does not contain a circuit element. A p-type diffusion region 44 is formed on the surface of the substrate 21, excluding the area under the extended electrode 43, in order to obtain a resistivity lower than that of the substrate 21. With this structure, the $p^+$-type isolation region 24 extends from the surface of the epitaxial layer 23 to the p-type diffusion region 44.

The diffusion region 44 is formed to take on the role assumed by the conventional semiconductor substrate. The diffusion region 44 has a diffusion depth of 10–20 μm, a peak impurity concentration of approximately $10^{16}$ atoms/$cm^3$, and a resistivity ρ of approximately 1–4 Ωcm. A diffusion region with this high level of an impurity concentration can prevent current leakage between island regions 25,25. An electrode 45 is formed on the surface of the isolation region 24 for providing the ground potential GND to the diffusion regions 44 through the isolation region 24, and the ground potential GND is given thereby for junction-isolation. The island region 25 below the extended electrode 43 exists in a floating state in which no potential is applied. Similarly, the island region 25 enclosing the J-FET element itself also exists in a floating state. The substrate 21 has a thickness of 200–400 μm. Whether an electrode of the backside of the substrate 21 is given the ground potential GND or not, is optional.

Figure 1:
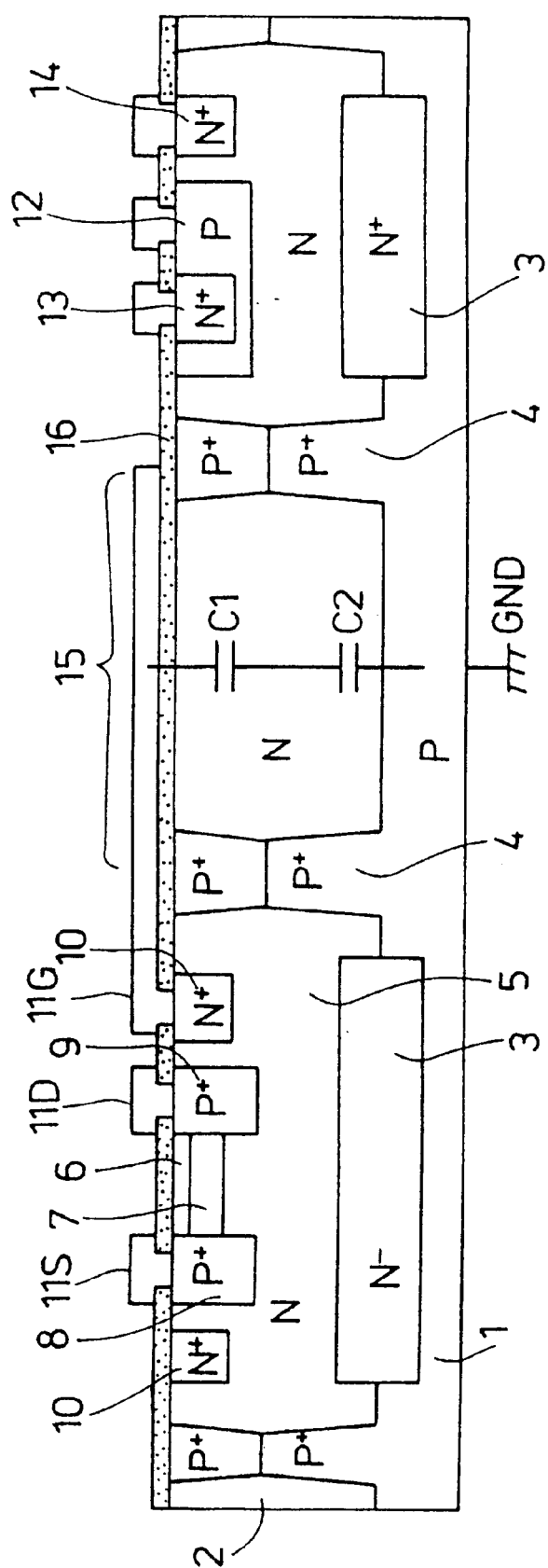
FIG. 1 is a cross-sectional diagram showing the structure of a conventional semiconductor device.
Figure 2:
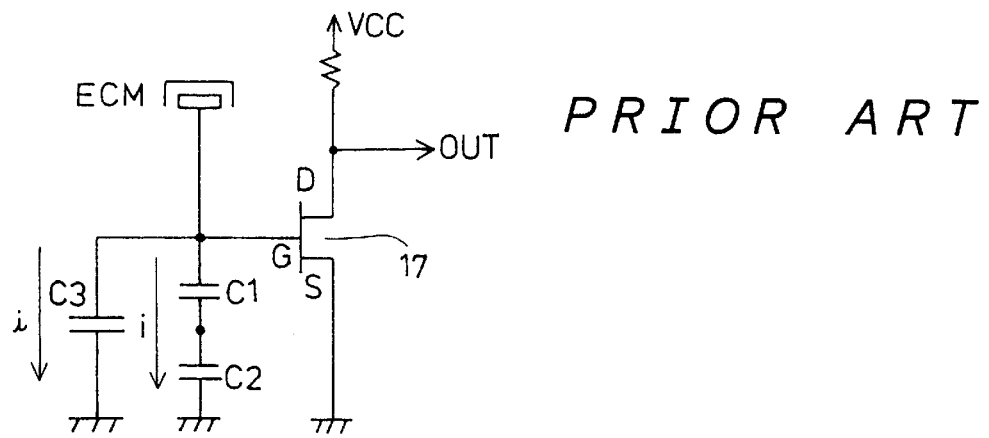
FIG. 2 is a schematic circuit diagram for the relevant parts of the conventional semiconductor device.
Figure 3:
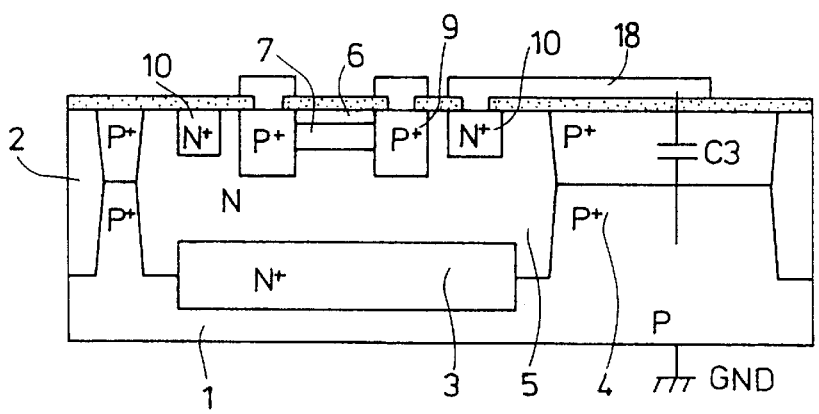
FIG. 3 is a cross-sectional diagram showing the structure of a conventional semiconductor device.

Each input/output portion of the integrated network is provided with an electrode pad comprised by an aluminum electrode. One of the electrode pads is a bonding pad 53, which is connected to the electrode 45 for grounding. The bonding pad 53 has a rectangular shape with each side measuring 100–300 μm. As with the extended electrode 43, the bonding pad 53 extends above the oxide film 42. Other electrode pads are similarly configured. A test pad 54 is connected to the gate electrode 35 apart from the extended electrode 43 for testing purposes. The test pad 54 is smaller than the other electrode pads with one side measuring 50–150 μm. The basic configuration of the test pad 54 is similar to that shown in FIG. 3. These pads are disposed around the peripheral of the semiconductor chip.

Figure 5:
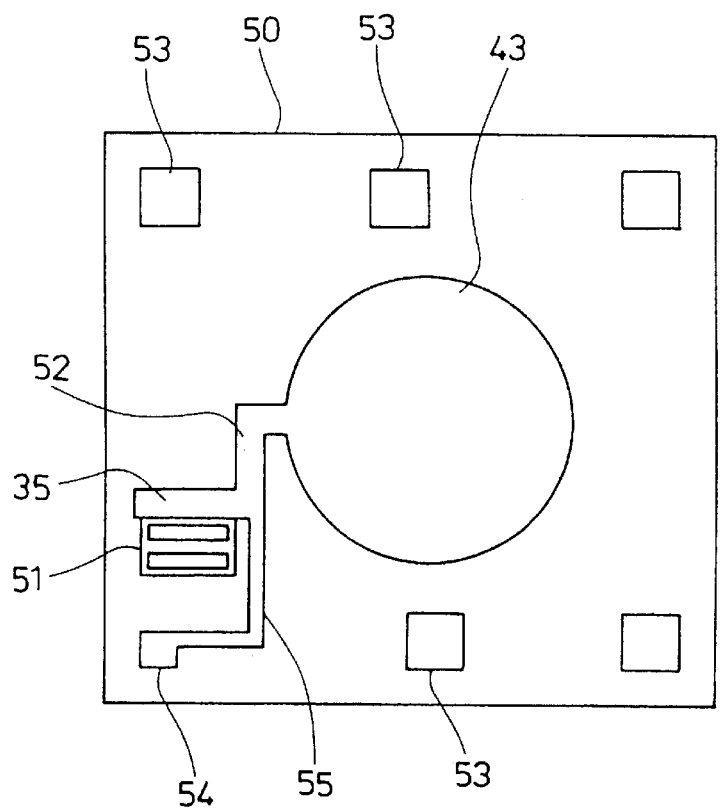
FIG. 5 is a plan view showing the semiconductor device of FIG. 4.

FIG. 5 is a plan view showing the overall layout of the semiconductor chip 50. The chip 50 is approximately 2.5× 3.0 mm. The extended electrode 43 is disposed in approximately the center portion of the chip 50 and has a diameter of approximately 1.0–1.5 mm. Various types of passive and active elements for forming an integrated network are disposed around the periphery of the extended electrode 43. The gate electrode 35 of a J-FET element 51 is connected to the extended electrode 43 by an electrode 52. A plurality of bonding pads 53 for outer connection is disposed at the periphery of the semiconductor chip 50. The bonding pads 53 have a square shape with one side measuring 100–300 μm. The test pad 54 is also connected to the gate electrode 35 of the J-FET element 51 via an electrode 55. The test pad 54 is smaller than the bonding pad 53 with each side measuring 50–150 μm. The test pad 54 is not connected to a bonding wire. The test pad serves to measure properties of the J-FET element 51 when wafer fabrication process is completed. Once tests have been completed, the test pad 54 no longer serves a purpose. Accordingly, while the bonding pad 52 connects to an external connector such as a bonding wire or a solder ball, the test pad 54 does not connect to anything externally in its mounted state. Hence, by constructing a smaller test pad 54, it is possible to decrease the parasitic capacitance C3 between the test pad 54 and p$^+$-type isolation region 24.

By giving the substrate 21 beneath the diffusion region 44 a high resistivity, the series resistance of the substrate 21 is extremely high. For considering electrical circuit, the state of the substrate 21 could almost be called an insulated state. Therefore, even if the circuit generates the capacitance C1 by the extended electrode 43 and isolation region 24 with the oxide film 42 serving as a dielectric and the capacitance C2 at the pn junction between the island region 25 and substrate 21, the work of the series resistance R creates a near insulated state high resistance at the end connection of the capacitance C2.

Figure 6:
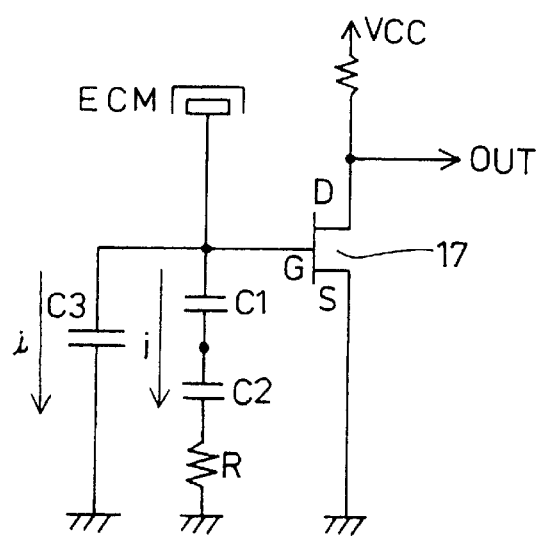
FIG. 6 is a schematic circuit diagram for the relevant parts of the semiconductor device of FIG. 4.

FIG. 6 shows a diagram of a circuit that includes the parasitic capacitances C1–C3. The parasitic capacitances C1 and C2 generated beneath the extended electrode 43 and the parasitic capacitance C3 generated beneath the test pad 54 are connected in parallel between the gate electrode and the ground potential GND. In the semiconductor device according to the present embodiment, the value of the capacitance C3 is decreased by selectively decreasing the size of the test pad. Also, the leakage current i is decreased by connecting a series resistance R in series with the capacitances C1 and C2.

Although another capacitance C3' generated by the pn junction between the island region 25 and isolation region 24 is connected between the capacitance C1 and the ground potential GND, this capacitance C3' is within a negligible range (several pF to several tens of pF of C1), when considering the surface ratio. However, when designing a pattern to take into account the capacitance C3' the electrode would ideally not be disposed on the surface of the isolation region 24 surrounding the extended electrode 43.

Next, a method of manufacturing the above-mentioned high resistivity substrate 21 will be described.

Figure 7A:
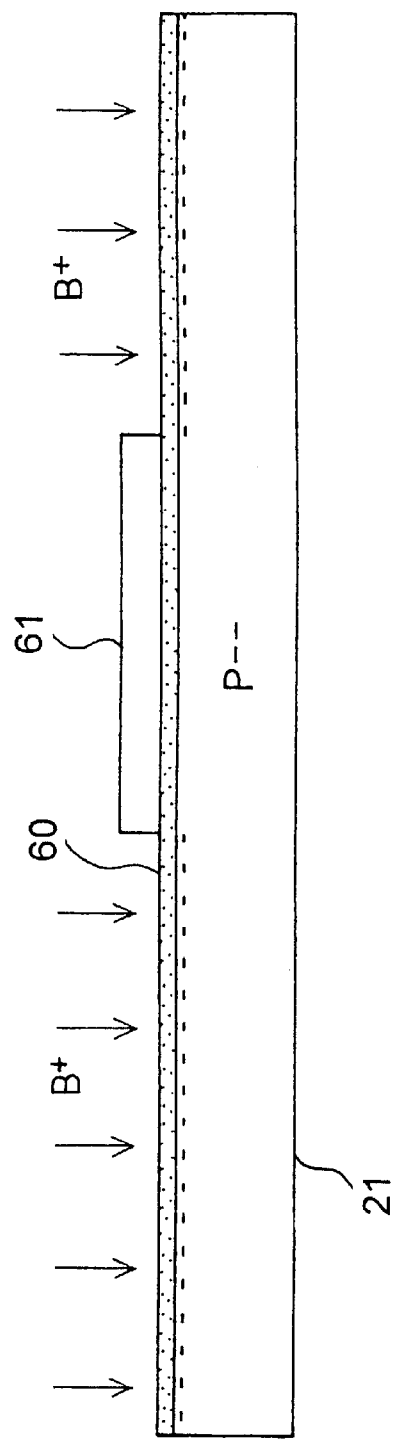
FIGS. 7A and 7B are cross-sectional diagrams showing the fabrication process of the semiconductor device of FIG. 4.

Step 1: Referring to FIG. 7A

A substrate 21 as described above is prepared with high resistivity. A p-type substrate is used as the starting point. If the resistivity is more than 1,000 Ωcm, however, it is difficult to define the conducting type, but it could be called an intrinsic (i) layer. The surface of the substrate is treated with thermal oxidation to form an oxide film 60. A resist mask 61 is formed over the oxide film 60. Boron (B) is selectively implanted in the entire surface of the substrate 21, except for areas masked out with the resist mask 61 for disposing the extended electrode 43.

Figure 7B:
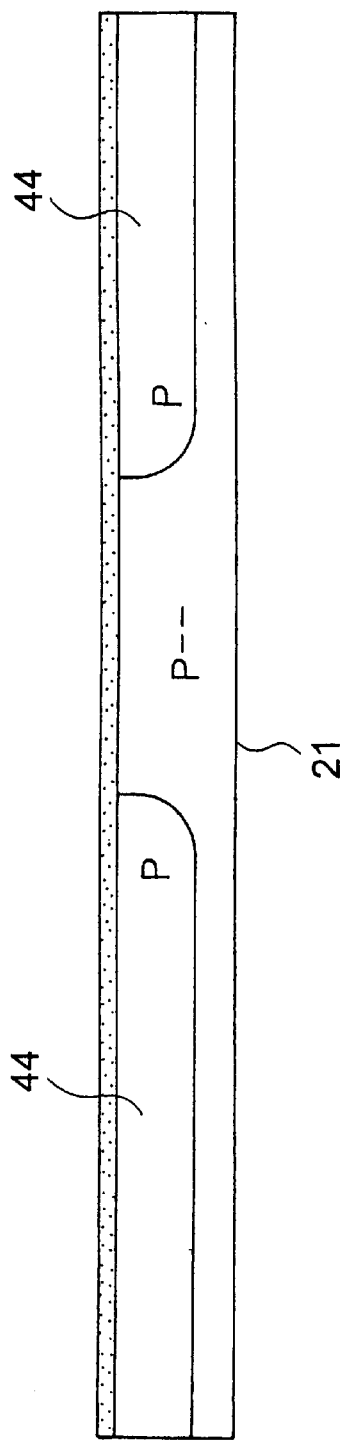

Step 2: Referring to FIG. 7B

The entire surface is heated at 1,100° C. for several hours to thermally diffuse the implanted boron and form the p-type diffusion region 44 in the surface of the substrate 21. The diffusion depth and impurity concentration are as described above.

Step 3: Referring to FIG. 8A

Antimony (Sb) is diffused in the surface of the substrate 21 to form an n$^+$-type buried layer 22. Next, boron is implanted in the surface of the substrate 21 to form the p$^+$-type buried layer 26 and an isolation region 24a.

Step 4: Referring to FIG. 8B

Next, the epitaxial layer 23 is formed by vapor deposition. The epitaxial layer 23 has a thickness of 5–12 μm and a resistivity ρ of 5–20 Ωcm.

A thermal diffusion process is performed repeatedly to form the various diffusion regions. Aluminum is deposited in through sputter deposition, and patterning is carried out to form various electrodes, including the extended electrode 43, bonding pad 53, and test pad 54 to complete the configuration shown in FIG. 4.

Figure 9:
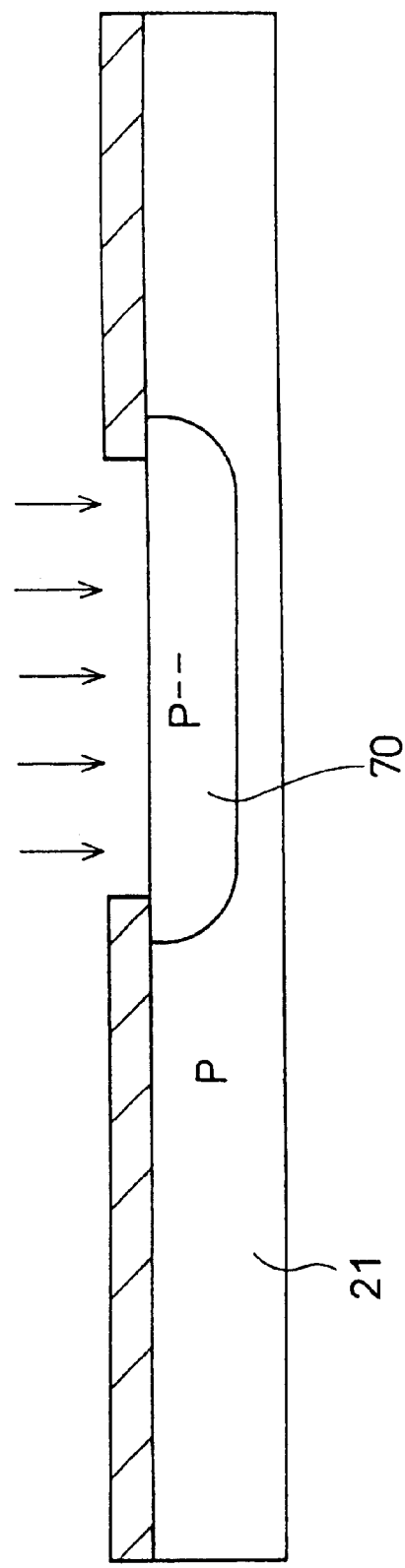
FIG. 9 is a cross-sectional diagram showing the fabrication process of the semiconductor device.

FIG. 9 is a cross-sectional diagram of the semiconductor device showing another embodiment of the manufacturing method. The previous embodiment used a substrate 21 with high resistivity to create a state of high resistivity beneath the extended electrode. In the present embodiment, however, an n-type impurity (arsenic, antimony, etc.) is selectively diffused beneath the extended electrode 43, thereby offsetting the conductivity and increasing resistivity.

FIG. 9 shows that a substrate 21 is prepared, which has a resistivity of 2–4 Ωcm, and which is generally used for fabricating ordinary bipolar integrated circuits. A predetermined mask is formed on the surface of the substrate 21 and an n-type impurity (arsenic, antimony, etc.) is selectively implanted in the region beneath the extended electrode 43, and a high resistivity region 70 is formed through thermal diffusion of the n-type impurity by offsetting the conductivity and increasing resistivity thereof. An appropriate amount of dose and thermal process should be selected so as to obtain the high resistivity region 70 at a resistivity of 100–5,000 Ωcm.

After then, the same process as described before is conducted again to obtain a structure, which is shown in FIG. 4. Thus, the semiconductor device has the high resistivity region 70 formed in the surface of the substrate 21 beneath the extended electrode.

In the embodiment described above, an n-channel J-FET was described, but it is also possible to form a p-channel J-FET in the semiconductor device. Further, a J-FET was used as the input transistor, but it is also possible to use an n-channel or p-channel MOSFET element.

In a semiconductor device according to the present invention, the surface area of the test pad 54 is smaller than that of the other bonding pads 53. Accordingly, it is possible to decrease the parasitic capacitance C3 between the test pad 54 and the ground potential GND, thereby decreasing leakage in current flowing to the ground potential GND.

Further, by providing a high resistivity substrate 21 or a high resistivity region 70, it is possible to create a near insulated state between the capacitances C1/C2 and the ground potential GND beneath the extended electrode 43. As a result, the present invention can decrease the leakage current i and prevent a drop in the level of signal inputted by the ECM, thereby resolving the problem inherent in conventional devices.

Even though using a high resistivity substrate for the substrate 21 in the present invention, a diffusion region 44 is provided beneath the circuit elements so as to ensure the role performed by the substrate in conventional devices. With this configuration, it is possible to prevent leakage between the island regions 25, thus achieving to ensure junction isolation between the circuit elements.

Although a certain preferred embodiment of the present invention has been shown and described in detail, it should be understood that various changes and modifications may be made therein without departing from the scope of the appended claims.

What is claimed is:

1. A semiconductor device for use with a microphone device, said semiconductor device comprising:

a semiconductor substrate;

an extended electrode for connecting to a microphone device, said extended electrode being disposed on said semiconductor substrate;

an input transistor having an input terminal disposed on said semiconductor substrate, said input terminal being connected to said extended electrode; and integrated network elements having diffusion regions disposed on said semiconductor substrate, said input transistor being integrated in said integrated network elements;

wherein said substrate comprises a high resistivity region beneath said extended electrode, said high resistivity region having a resistivity of 100–5000 $\Omega$cm.

2. A semiconductor device according to claim 1, wherein a resistivity of a region in said substrate beneath said integrated network elements is lower than said high resistivity region.

3. A semiconductor device according to claim 1, wherein said substrate has a uniform resistivity of 100–5000 $\Omega$cm, and diffusion regions are formed beneath said integrated network elements so as to decrease resistivities thereof.

4. A semiconductor device according to claim 1, wherein said substrate has a uniform resistivity suitable for said integrated network elements, and a diffusion region is formed beneath said extended electrode so as to increase resistivity to 100–5000 $\Omega$cm.

* * * * *